(12) United States Patent
Horikawa et al.

(10) Patent No.: US 6,946,918 B2
(45) Date of Patent: Sep. 20, 2005

(54) DIFFERENTIAL VOLTAGE TO CURRENT CONVERTER HAVING TRANSISTORS OF DIFFERENT SIZES

(75) Inventors: Akira Horikawa, Chiba (JP); Shuichi Matsumoto, Chiba (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 98 days.

(21) Appl. No.: 10/340,598

(22) Filed: Jan. 13, 2003

(65) Prior Publication Data

US 2003/0132805 A1 Jul. 17, 2003

Related U.S. Application Data

(60) Provisional application No. 60/348,317, filed on Jan. 16, 2002.

(51) Int. Cl.[7] ................................................. H03L 7/00
(52) U.S. Cl. .............................. 331/34; 331/57; 331/160
(58) Field of Search ........................ 331/34, 57, 108 R, 331/109, 160, 176; 327/103, 108

(56) References Cited

U.S. PATENT DOCUMENTS

| | | | | |
|---|---|---|---|---|
| 5,355,333 A | * | 10/1994 | Pascucci | ................. 365/189.01 |
| 5,479,091 A | * | 12/1995 | Chloupek | ................... 323/312 |
| 6,229,403 B1 | * | 5/2001 | Sekimoto | ..................... 331/57 |
| 6,710,667 B2 | * | 3/2004 | Nagano | ...................... 331/57 |
| 2004/0041593 A1 | * | 3/2004 | Lai | ............................ 326/115 |

* cited by examiner

Primary Examiner—Robert Pascal
Assistant Examiner—Joseph Chang
(74) Attorney, Agent, or Firm—Volentine Francos & Whitt, PLLC

(57) ABSTRACT

A voltage/current converting circuit has a differential circuit. The differential circuit has a first input terminal coupled to receive an input voltage signal, a second input terminal coupled to receive a reference voltage signal and an output terminal for outputting an electrical current in response to a comparison of the input voltage signal and the reference voltage signal. The differential circuit includes first and second transistors. The first transistor has a control terminal connected to the first input terminal and has a first dimension. The second transistor has a control terminal connected to the second input terminal and has a second dimension that is different from the first dimension.

14 Claims, 4 Drawing Sheets

DIFFERENTIAL VOLTAGE TO CURRENT CONVERTER HAVING TRANSISTORS OF DIFFERENT SIZES

This application claims the benefit of 60/348,317 filed Jan. 16, 2002.

BACKGROUND OF THE INVENTION

The present invention relates to a voltage/current converting circuit and a phase synchronizing circuit, and particularly relates to the phase synchronizing circuit using an electric current control oscillator, and the voltage/current converting circuit suitable for the phase synchronizing circuit.

The conventional phase synchronizing circuit (PLL circuit) uses a conventional electric current control oscillator.

In the conventional phase synchronizing circuit, an input signal (e.g., a reference clock signal) and an output signal of a frequency dividing circuit are inputted to a phase comparator. A phase difference is determined by the phase comparator. A control voltage is changed (smoothed) by charging or discharging an electric current according to a phase comparing result (phase difference information) to a loop filter by a charge pump circuit. A voltage control oscillator generates an oscillating signal having a frequency according to the control voltage smoothed by the loop filter. The oscillating signal is divided into N-frequencies by the frequency divider, and is fed back to the phase comparator.

An output signal (oscillating signal) from the voltage control oscillator and an output signal (frequency dividing signal) from the frequency dividing circuit are output to the outside as an output signal synchronized with the input signal to the phase synchronizing circuit from the phase synchronizing circuit. An electric current control oscillator is provided such that the voltage control oscillator includes the electric current control oscillator and a voltage/current converting circuit (V-I converter).

Namely, the voltage/current converting circuit converts the control voltage smoothed by the loop filter to a control electric current. The electric current control oscillator generates an oscillating signal having a frequency according to the control electric current.

There is also a phase synchronizing circuit having no frequency dividing circuit. If the phase comparator and the loop filter have a specific construction, no charge pump circuit is required therein. Therefore, no charge pump circuit is described in many cases in a block diagram as a constructional element within the phase comparator and the loop filter even when the charge pump circuit is required.

In the voltage control oscillator, a frequency control electric current from the voltage/current converting circuit is different in accordance with changes in a temperature condition, a process condition, a power supply voltage, etc. even when the oscillating signal of the same oscillating frequency is outputted.

Further, in the electric current control oscillator, it is desirable to set a frequency variable range to shorten a lock time, and avoid the oscillation at a frequency greatly shifted from an expected frequency. In this case, a circuit construction for limiting the electric current is used in the voltage/current converting circuit.

However, the number of satisfiable voltage/current converting circuits with the electric current limit was conventionally small.

Namely, in many conventional voltage/current converting circuits with the electric current limited, no linearity of input voltage and output electric current characteristics can be held near the limit electric current. A voltage frequency conversion coefficient of the voltage control oscillator is greatly differently seen in case the voltage control oscillator utilizes the voltage/current converting circuit. Further, even when the loop filter of the same constant is used, a problem exists in that no phase synchronizing circuit can be set to a lock state when the frequency control electric current reaches the vicinity of the limit electric current by the power voltage change, the temperature change and the process variation.

Therefore, the voltage/current converting circuit having a wide range of the linearity of the input voltage and output electric current characteristics is desired. Further, the phase synchronizing circuit able to preferably perform a phase synchronizing operation is desired even when the frequency control electric current from the built-in voltage/current converting circuit is close to the limit electric current.

SUMMARY OF THE INVENTION

To solve such a problem, a voltage/current converting circuit of a first invention includes a differential pair including a first transistor having a control terminal applied to an input voltage and a second transistor having a control terminal applied to a bias voltage, which is characterized in that the sizes of the first and second transistors are different from each other.

A phase synchronizing circuit of a second invention includes a voltage control oscillator having a voltage/current converting circuit and an electric current control oscillator connected in series, which is characterized in that the voltage/current converting circuit of the first invention is applied as the voltage/current converting circuit.

DETAILED DESCRIPTION OF THE PREFERRED EMBODIMENTS

One embodiment of each of a voltage/current converting circuit and a phase synchronizing circuit of the invention will next be described in detail with reference to the drawings.

Figure 2:
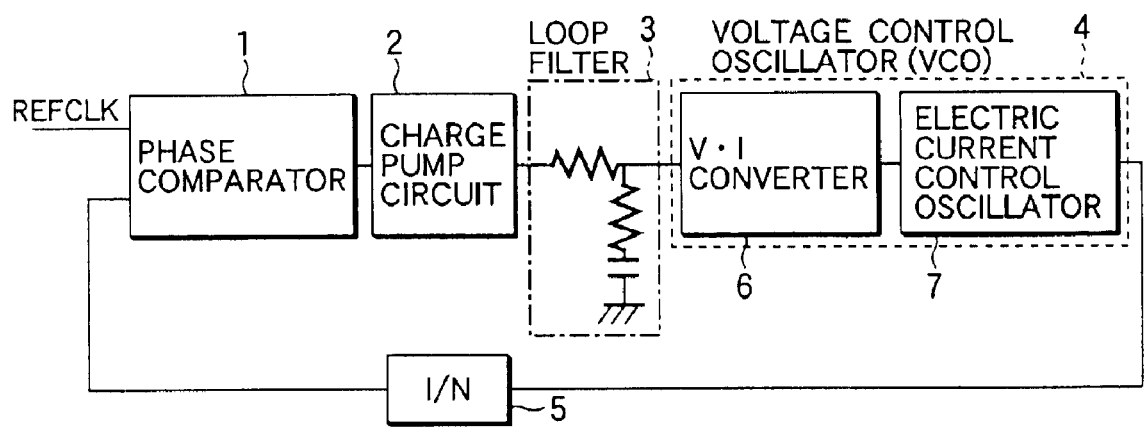
FIG. 2 is a block diagram showing a phase synchronizing circuit using an electric current control oscillator.

The entire construction of the phase synchronizing circuit in this embodiment can be shown by FIG. 2. The voltage/ current converting circuit of the embodiment will be explained below.

Figure 1:
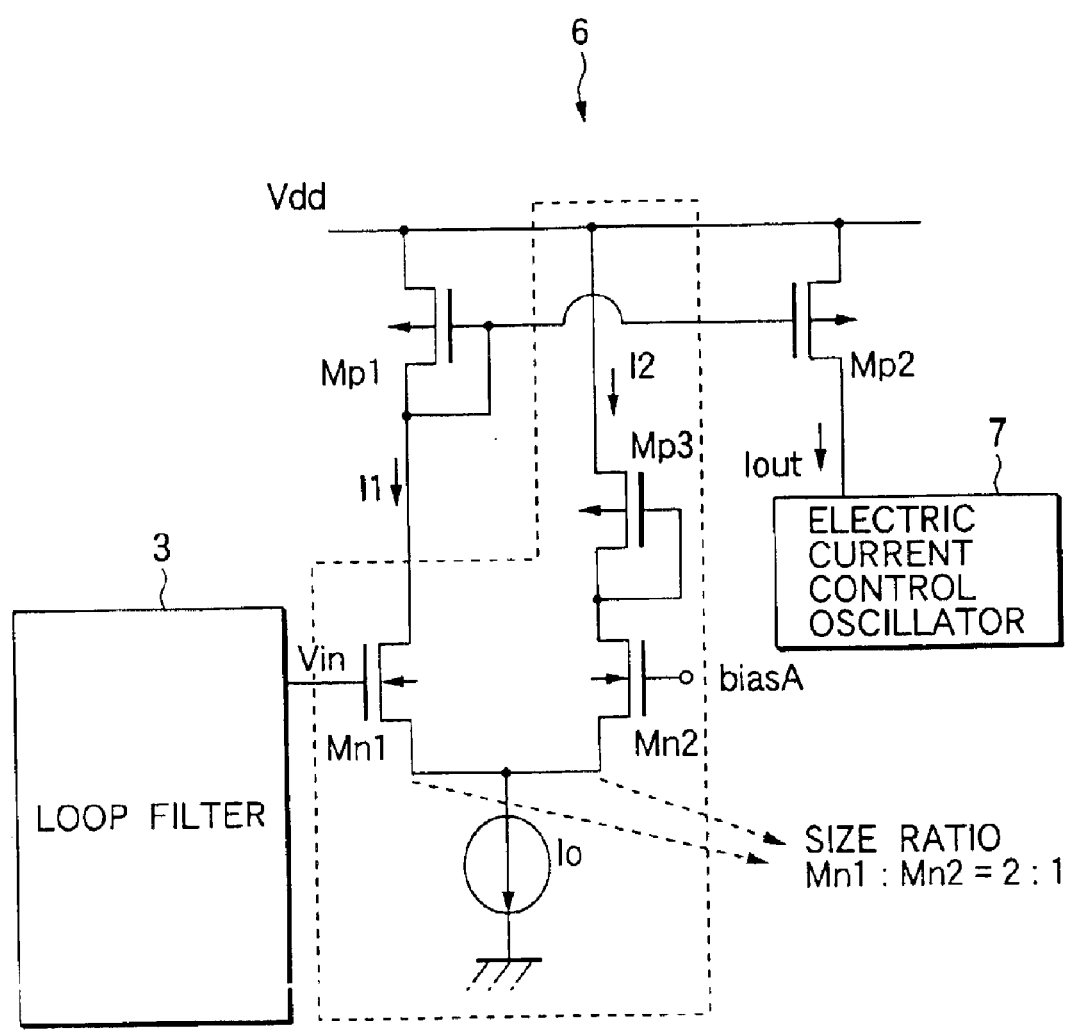
FIG. 1 is a circuit diagram showing the construction of a voltage/current converting circuit of an embodiment.

FIG. 1 is a block diagram showing the construction of the voltage/current converting circuit 6 of the embodiment. In FIG. 1, the same reference numerals are designated in the same and corresponding portions to FIG. 2.

In FIG. 1, the sources of two NMOS transistors Mn1 and Mn2 are connected to each other and construct a differential pair, and its common source is connected to the ground through a constant electric current source I0. An output control voltage Vin of a loop filter 3 is applied to the gate of one NMOS transistor Mn1 constructing the differential pair. A bias voltage biasA is applied to the gate of the other NMOS transistor Mn2.

A PMOS transistor Mp1 bears a load function of the NMOS transistor Mn1. The source of the PMOS transistor Mp1 is connected to a power supply terminal Vdd, and the gate and the drain of the PMOS transistor Mp1 are connected to the drain of the NMOS transistor Mn1. A PMOS transistor Mp3 bears a load function of the NMOS transistor Mn2. The source of the PMOS transistor Mp3 is connected to the power supply terminal Vdd and the gate and the drain of the PMOS transistor Mp3 are connected to the drain of the NMOS transistor Mn2.

A PMOS transistor Mp2 bears an output function. The gate of the PMOS transistor Mp2 is connected to the gate and the drain of the PMOS transistor Mp1, and the source of the PMOS transistor Mp2 is connected to the power supply terminal Vdd. The drain of the PMOS transistor Mp2 is connected to a control electric current input terminal of an electric current control oscillator 7.

As can be seen from the above connection, the PMOS transistors Mp1 and Mp2 construct a current mirror circuit. The same electric current as an electric current I1 provided between the drain and the source of the PMOS transistor Mp1 is provided as a control electric current Iout from the PMOS transistor Mp2 to the electric current control oscillator 7.

Here, the sizes of transistors constructing a differential amplifying circuit (differential pair) are generally set to be equal (1:1). However, in the voltage/current converting circuit of this embodiment, the sizes of the NMOS transistors Mn1 and Mn2 constructing the differential amplifying circuit (differential pair) are selected such that the sizes are different from each other. For example, the sizes are selectively set to 2:1. This is because linearity near the limit electric current between an input voltage Vin and an output electric current Iout is considered.

The operation of the voltage/current converting circuit 6 of the embodiment will next be explained.

The constant electric current Io is basically distributed to electric currents I1 and I2 provided to the PMOS transistors Mp1 and Mp3 in accordance with the input voltage Vin (and an electric potential difference of the bias voltage VbiasA). The electric current I1 provided to the PMOS transistor Mp1 becomes the output electric current Iout by the current mirror construction formed by the PMOS transistors Mp1 and Mp2 and is supplied to the electric current control oscillator 7.

Here, it is important that the input voltage Vin and the output electric current Iout are linear. It will be next explained that the voltage/current converting circuit 6 of the embodiment is also attained near the limit electric current. In the following explanation, for brevity of the explanation, the size ratio of the NMOS transistors Mn1 and Mn2 is set to 2:1. Further, the electric potentials of the sources of the NMOS transistors Mn1 and Mn2 are explained as Va.

The operation and effects of the embodiment are easily explained when the embodiment is compared with the case (comparative example) of 1:1 in the size ratio of the NMOS transistors Mn1 and Mn2. Therefore, the circuit operation of the comparative example will first be explained in detail. The circuit of the comparative example is set to the same as the voltage/current converting circuit of the embodiment except for the size ratio of the NMOS transistors Mn1 and Mn2.

Figure 4:
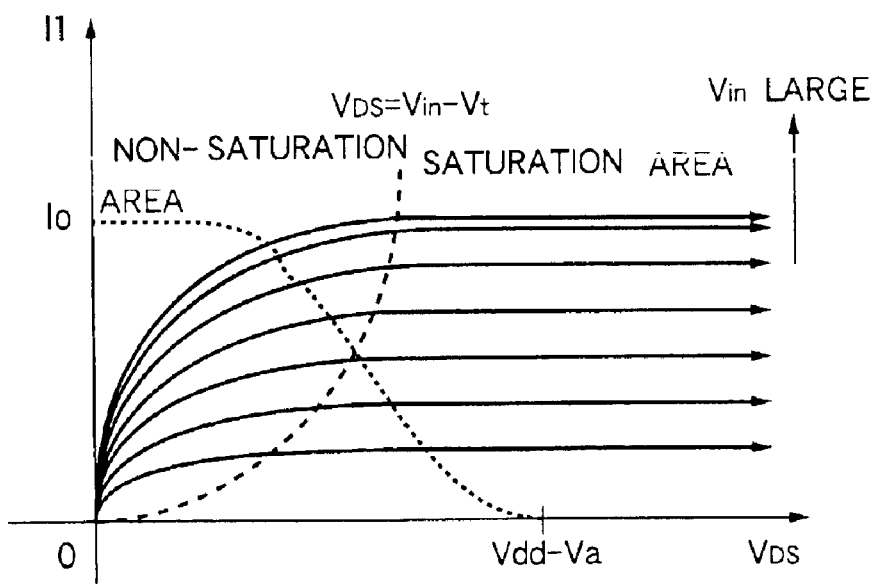
FIG. 4 is an explanatory view showing the characteristics of one transistor of a differential pair in the comparative example circuit (transistor size ratio 1:1).

FIG. 4 shows VDS-I1 characteristics (I1 designates the electric current value between the drain and the source, and VDS designates the voltage between the drain and the source of the NMOS transistor Mn1) by a solid line with respect to the NMOS transistor Mn1 when the input voltage Vin in a circuit portion within a dotted line of FIG. 1 is increased every constant interval in the comparative example circuit. A broken line of FIG. 4 shows the boundary line of a saturation area and a non-saturation area of the NMOS transistor Mn1. The voltage VDS* between the drain and the source on the boundary line is shown by VDS*= Vin−Vt (Vt is a value provided by adding the voltage of Va and the threshold value voltage of the NMOS transistor Mn1). The left-hand side from the boundary line is set to the non-saturation area, and the right-hand side from the boundary line is set to the saturation area. A dotted line of FIG. 4 shows a load line formed from the voltage between the drain and the source of the PMOS transistor Mp1. When the electric current value I1 between the drain and the source approaches the electric current value I0 in the constant electric current source I0, the voltage VDS between the drain and the source of the NMOS transistor Mn1 suddenly drops.

Figure 3:
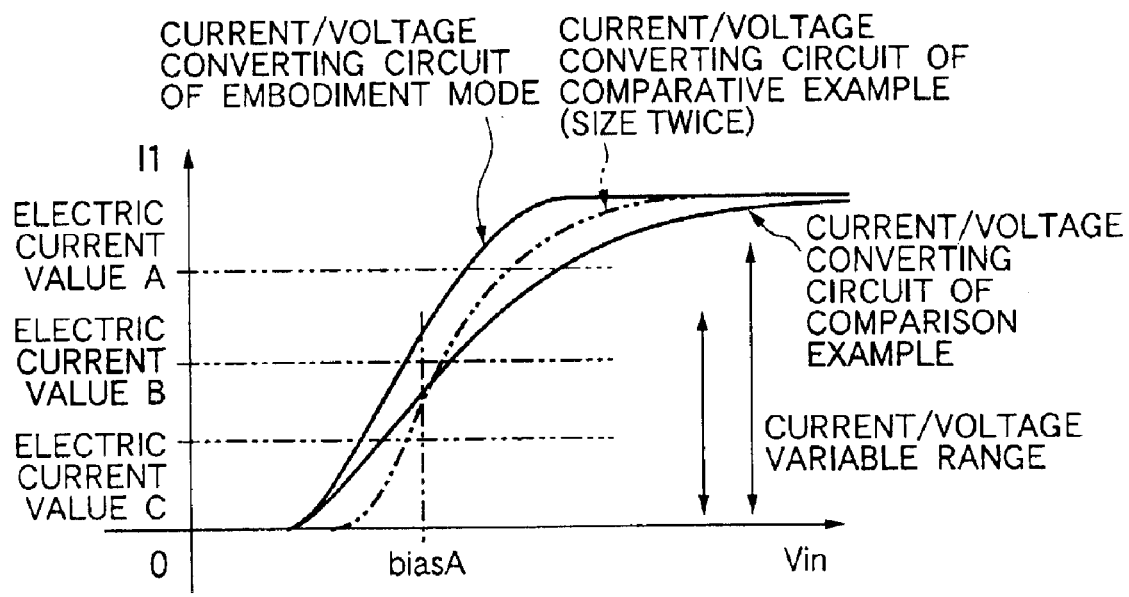
FIG. 3 is an explanatory view showing the difference in input voltage and output electric current characteristics between the voltage/current converting circuit of the embodiment and a comparative example circuit.

An intersection point of the load line (dotted line) of FIG. 4 and the graph of the VDS-I1 characteristics (solid line) of the NMOS transistor Mn1 shows input voltage and output electric current characteristics of the voltage/current converting circuit 6. When the graph is rewritten by using the intersection point in FIG. 4, Vin-I1 (Iout) characteristics are obtained as shown in FIG. 3. It is understood from FIGS. 4 and 3 that the voltage/current conversion is approximately performed linearly while the NMOS transistor Mn1 is located in the saturation area. Namely, while the electric current I1 is sufficiently small, the electric current I1 is linearly increased with respect to the input voltage Vin. When the electric current I1 reaches the vicinity of the limit electric current I0, it is understood that the increase ratio is reduced and the electric current I1 is increased in accordance with a gentle curve.

With respect to the output electric current Iout, an electric current equivalent to the electric current I1 is outputted by the current mirror constructed by the PMOS transistors Mp1 and Mp2.

The following relation formula (1) is formed when the NMOS transistors Mn1 and Mn2 are operated in the saturation area. In this formula (1), β means $\beta = \mu$ CoxW/L ($\mu$ shows electron mobility, Cox a gate capacity, W a channel width of the transistor, and L shows a channel length of the transistor).

$$Vin - VbiasA = \sqrt{(2I1/\beta)} - \sqrt{(2I2/\beta)} \tag{1}$$

The following formula (2) is obtained when an inclination dI1/dVin at an electric current value for forming I1=I0/2 is calculated by differentiating the formula (1) by I1.

$$dI1/dVin = \sqrt{(\beta Io/2)} \tag{2}$$

However, in the non-saturation area, the increase ratio of the output electric current with respect to the input voltage is lowered so that nonlinearity is formed.

Here, it is necessary to raise the electric current value at the intersection point of the boundary line (broken line) of the saturation area and the non-saturation area and the load line (dotted line) seen from the entire circuit so as to extend the linearity of the voltage/current conversion.

Figure 5:
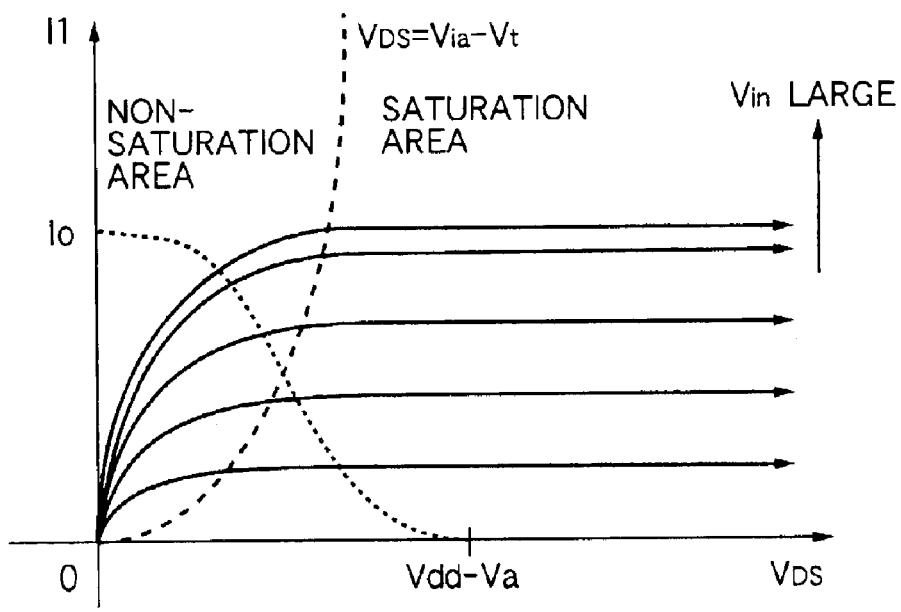
FIG. 5 is an explanatory view showing the characteristics of one transistor of the differential pair in the comparative example circuit (transistor size ratio 2:2).

In this case, it is normally considered to set the transistor size to be twice while the ratio 1:1 of the left-hand and right-hand transistors in the comparative example circuit is maintained. The characteristics in such a setting case become characteristics as shown in FIG. 5. The following relation formula (3) is formed when the NMOS transistors Mn1 and Mn2 are operated in the saturation area.

$$Vin-VbiasA=\sqrt{(2I1/2\beta)}-\sqrt{(2I2/2\beta)} \qquad (3)$$

The following formula (4) is obtained when an inclination $dI1/dVin$ at an electric current value for forming $I1=I0/2$ is calculated by differentiating the formula (3) by $I1$.

$$dI1/dVin=\sqrt{\beta I0}/\sqrt{2} \qquad (4)$$

It is understood from comparison of the formulas (2) and (4) that the voltage/current conversion coefficient of the differential amplifying circuit becomes $\sqrt{2}$ times in comparison with the case of the original size. The VDS-I1 characteristic is provided by intervals shown by the solid line of FIG. 5 with respect to a change every predetermined amount of the input voltage. The inclination of the boundary line of the saturation area and the non-saturation area becomes steep in comparison with the case of the original transistor size. However, with respect to the voltage Va at a turning-off time of the NMOS transistor Mn1, the transistor size is increased from the size value in the original case so that the load line (dotted line) is shifted in the leftward direction. No electric current value at the intersection point of the load line (dotted line) and the boundary line of the saturation area and the non-saturation area of the NMOS transistor Mn1 is almost changed. When the graph is rewritten by using the intersection point with respect to FIG. 5, Vin-I1 characteristics shown by the dotted line of FIG. 3 are obtained. The voltage/current conversion coefficient is entirely increased from the dotted line of FIG. 3. However, in a large portion of I1, e.g., when I1 is close to the electric current value A, it is understood that no linearity is obtained similarly to the circuit before the size is changed. Namely, no extension of the linearity as the voltage/current converting circuit 6 can be attained even when the sizes of the NMOS transistors Mn1 and Mn2 are increased every equal magnification.

Figure 6:
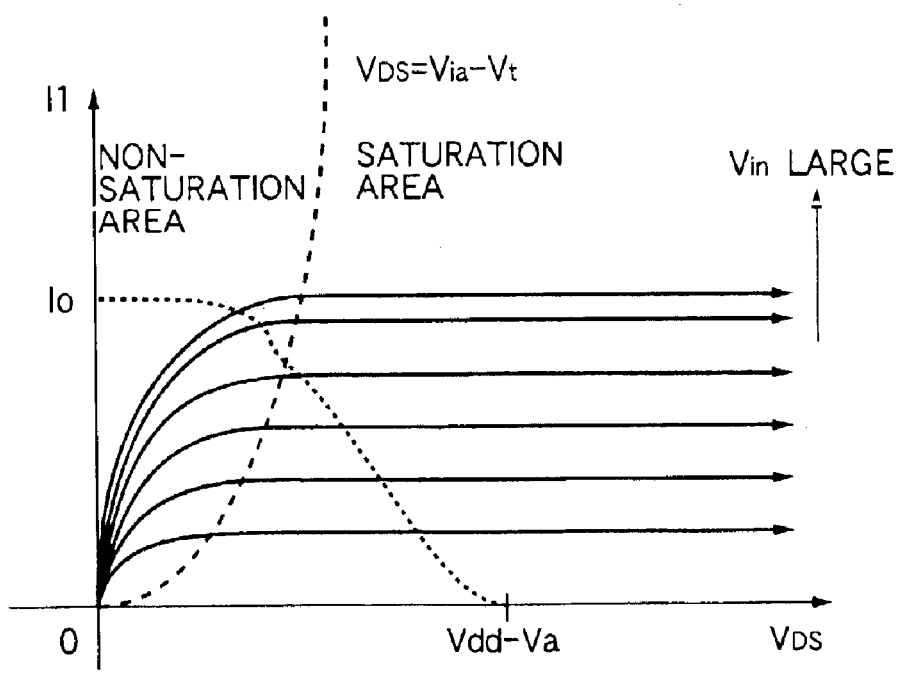
FIG. 6 is an explanatory view showing the characteristics of one transistor of a differential pair in the voltage/current converting circuit of the embodiment (transistor size ratio 2:1).

In contrast to this, when the ratio of the left-hand and right-hand transistors of the amplifying pair is set to 2:1 as in the embodiment, its characteristics are provided as shown in FIG. 6. In FIG. 6, each curve is shown similarly to FIGS. 4 and 5.

The following formula (5) is formed when the NMOS transistors Mn1 and Mn2 are operated in the saturation area. The following formula (6) is obtained when an inclination $dI1/dVin$ at an electric current value for forming $I1=I0/2$ is calculated by differentiating the formula (5) by $I1$.

$$Vin-VbiasA=\sqrt{(2I1/2\beta)}-\sqrt{(2I2/\beta)} \qquad (5)$$

$$dI1/dVin=\sqrt{2\beta Io}/(1+\sqrt{2}) \qquad (6)$$

From formulas (2) and (6), the voltage/current conversion coefficient of the differential amplifying circuit becomes about $(4-2\sqrt{2})$ times that of the comparative example circuit first explained. The VDS-I1 characteristics are provided by intervals as shown by the solid line of FIG. 6 with respect to the change every predetermined amount of the input voltage. The inclination of the boundary line of the saturation area and the non-saturation area of the NMOS transistor Mn1 is steep in comparison with the comparative example circuit. Further, the voltage of Va at the turning-off time of the NMOS transistor Mn1 is the same voltage as the voltage/current converting circuit of the comparative example first explained. Accordingly, it is known that the electric current enters the non-saturation area at a high electric current value when the intersection point is seen without shifting the load line in the leftward direction.

Namely, the linearity of the input voltage and the output electric current can be extended in the voltage/current converting circuit of the embodiment.

When the above contents are rearranged, the following contents are understood as can be seen from FIG. 3. Namely, if the sizes of the NMOS transistors Mn1 and Mn2 are the same, no approximately equal voltage/current conversion coefficient can be obtained near three electric current values A, B and C even when the size is increased. In contrast to this, the approximately equal voltage/current conversion coefficient can be obtained near the three electric current values A, B and C in the voltage/current converting circuit of the embodiment.

As mentioned above, the output electric current Iout becomes an electric current equivalent to the electric current I1 by the current mirror constructed by the PMOS transistors Mp1 and Mp2. Namely, the linearity of the input voltage Vin and the output electric current Iout is attained even when the output electric current Iout is large.

Since the output electric current Iout is set to a frequency control electric current of the electric current control oscillator 7, it is possible to enter a lock state in the phase synchronizing circuit of the embodiment even when the phase synchronizing circuit is used near the above three electric current values A, B and C.

In accordance with the voltage/current converting circuit of the above embodiment, the linearity of the voltage/current converting function can be extended by using the differential amplifying circuit having different sizes of the left-hand and right-hand transistors without increasing the limited electric current value even when the electric current limit function is added.

Further, in accordance with the phase synchronizing circuit of the embodiment, since the voltage/current converting circuit of the embodiment is applied, there are the effects that the phase synchronizing circuit is strong against a temperature condition and a process variation and a phase synchronizing loop can enter the lock state in a loop filter of the same constant.

In the voltage/current converting circuit of the above embodiment, the size ratio of the left-hand and right-hand transistors of the differential amplifying circuit is set to 2:1, but may be also set to other ratios. For example, the size ratio of the transistors may be determined in accordance with the characteristics of the electric current control oscillator. The other ratios may be set to e.g., 1.1:1 or more in which no sizes are seen as the same size.

The current mirror circuit is not limited to the construction shown in FIG. 1, but there can be also applied to e.g., the current mirror circuit of a cascode type.

Further, in the above embodiment, the electric current I1 flowed to the PMOS transistor Mp1 is set to the output electric current Iout by the current mirror circuit. However, the electric current I2 flowed to the PMOS transistor Mp3 may be also set to the output electric current Iout by the current mirror circuit. For example, if the input electric current and the oscillating frequency are inversely proportional in the electric current control oscillator, it is preferable to set the electric current I2 to the output electric current Iout.

Further, in the above embodiment, the size of the NMOS transistor Mn1 is larger than the size of the NMOS transistor Mn2. However, the size of the NMOS transistor Mn2 may be also reversely larger than the size of the NMOS transistor Mn1. The extension of the linearity can be also attained in such a case.

Further, in the above embodiment, the differential pair is constructed by the NMOS transistors, but the present invention can be also applied to a structure in which the differential pair is constructed by PMOS transistors. Further, the kind of the transistor is not limited to the MOS transistor, but may be another unipolar transistor (MIS, MES, etc.) and may be also a bipolar transistor.

Each transistor constructing the differential pair, etc. may be constructed by Darlington connection. In short, it is sufficient if it is seen as one transistor, and the transistor sizes are different from each other when it is seen as one transistor.

In the above embodiment, the voltage/current converting circuit is applied to the phase synchronizing circuit, but the voltage/current converting circuit of the present invention can be applied to other circuits.

The construction of the above phase synchronizing circuit is not limited to the construction shown in FIG. 2. For example, the construction may be also set to a construction including no frequency dividing circuit. In short, it is sufficient if the voltage/current converting circuit is included.

In accordance with the voltage/current converting circuit of the invention, the sizes of a first transistor whose control terminal is given an input voltage and a second transistor whose control terminal is given a bias voltage, constructing the differential pair, are different from each other. Accordingly, the range of linearity of input voltage and output electric current characteristics can be widened.

In accordance with the phase synchronizing circuit of the invention, the voltage/current converting circuit of the invention is applied as the voltage/current converting circuit constituting a voltage control oscillator together with an electric current control oscillator. Accordingly, a phase synchronizing operation can be preferably performed even when a frequency control electric current from the voltage/current converting circuit is close to a limit electric current.

What is claimed is:

1. A voltage/current converting circuit comprising:
   a differential circuit having a first input terminal coupled to receive an input voltage signal, a second input terminal coupled to receive a reference voltage signal and an output terminal for outputting an electrical current in response to a comparison of the input voltage signal and the reference voltage signal, the differential circuit comprising:
   a first transistor having a control terminal connected to the first input terminal, the first transistor having a first dimension; and
   a second transistor having a control terminal connected to the second input terminal, the second transistor having a second dimension that is different from the first dimension; and,
   a current mirror circuit connected to the output terminal, wherein the current mirror circuit comprises:
   a third transistor, which is a MOS transistor, having a source connected to a power supply voltage source and a drain and a control terminal connected to a drain of the first transistor; and
   a fourth transistor, which is a MOS transistor, having a source connected to the power supply voltage source and a drain connected to the output terminal and a control terminal connected to the control terminal of the third transistor.

2. A voltage/current converting circuit according to claim 1, wherein the first dimension is greater than the second dimension.

3. A voltage/current converting circuit according to claim 2, wherein a proportion of the first dimension and the second dimension is 2:1.

4. A voltage/current converting circuit according to claim 1, wherein the first and second transistors are MOS transistors, and wherein the differential circuit further comprises a constant electric current source connected between sources of the first and second transistors and ground.

5. A phase synchronizing circuit comprising:
   a phase comparator receiving an input signal and a feedback signal, the phase comparator determining a phase difference of the received signals and outputting a phase difference signal;
   a charge pump circuit connected to the phase comparator, the charge pump circuit providing a first electric current in response to the phase difference signal;
   a loop filter connected to the charge pump circuit, the loop filter generating an internal signal having a control voltage determined by the first electric current;
   a voltage/current converting circuit comprising a differential circuit having a first input terminal coupled to receive the internal signal, a second input terminal coupled to receive a reference voltage signal and an output terminal for outputting a second electrical current in response to a comparison of the internal signal and the reference voltage signal, the differential circuit comprising:
   a first transistor having a control terminal connected to the first input terminal, the first transistor having a first dimension, and
   a second transistor having a control terminal connected to the second input terminal, the second transistor having a second dimension that is different from the first dimension; and
   a current control oscillator connected to the voltage/current converting circuit, the voltage control oscillator generating an oscillating signal having a frequency according to the second electrical current; and
   a frequency dividing circuit connected to the voltage control oscillator, the frequency dividing circuit dividing a frequency of the oscillating signal so as to generate the feedback signal.

6. A phase synchronizing circuit according to claim 5, wherein the first dimension is greater than the second dimension.

7. A phase synchronizing circuit according to claim 6, wherein a proportion of the first dimension and the second dimension is 2:1.

8. A phase synchronizing circuit according to claim 5, wherein the differential circuit further comprises a current mirror circuit connected to the output terminal thereof.

9. A phase synchronizing circuit according to claim 8, wherein the current mirror circuit comprises:
   a third transistor, which is a MOS transistor, having a source connected to a power supply voltage source and a drain and a control terminal connected to a drain of the first transistor, and a fourth transistor, which is a MOS transistor, having a source connected to the power supply voltage source and a drain connected to the output terminal and a control terminal connected to the control terminal of the third transistor.

10. A phase synchronizing circuit according to claim 5, wherein the first and second transistors are MOS transistors; and wherein the differential circuit further comprises a constant electric current source connected between sources of the first and second transistors and ground.

11. A voltage/current converting circuit comprising:

a first input terminal coupled to receive an input voltage signal;

a second input terminal coupled to receive a reference voltage signal;

an output terminal for providing an output electrical current;

a current mirror circuit connected to the output terminal and a power supply voltage source, the current mirror circuit providing an electrical current in response to an internal electrical current;

a differential circuit connected to the current mirror circuit, the power supply voltage source and the first and second input terminals, the differential circuit providing the internal current in response to a comparison of the input voltage signal and the reference voltage signal, the differential circuit comprising:

a first transistor, which is a MOS transistor, having a control terminal connected to the first input terminal, the first transistor having a first dimension; and a second transistor having a control terminal connected to the second input terminal, the second transistor having a second dimension that is different from the first dimension, and wherein a proportion of the first dimension and the second dimension is 2:1.

12. A voltage/current converting circuit according to claim 11, wherein the first dimension is greater than the second dimension.

13. A voltage/current converting circuit according to claim 11, wherein the current mirror circuit includes, a third transistor having a source connected to the power supply voltage source, a drain for providing the internal electrical current and a control terminal connected to the drain thereof, and a fourth transistor having a source connected to the power supply voltage source and a drain connected to the output terminal and a control terminal connected to the control terminal of the third transistor.

14. A voltage/current converting circuit according to claim 11, wherein the first and second transistors are MOS transistors, further comprising a constant electric current source connected between sources of the first and second transistors and ground.

* * * * *